United States Patent [19]
Novak et al.

[11] Patent Number: 6,046,952
[45] Date of Patent: Apr. 4, 2000

[54] METHOD AND APPARATUS FOR OPTIMIZING MEMORY PERFORMANCE WITH OPPORTUNISTIC REFRESHING

[75] Inventors: Stephen T. Novak, Sunnyvale; John C. Peck, Jr., San Francisco; Scott Waldron, Belmont, all of Calif.

[73] Assignee: Advanced Micro Devices, Inc., Sunnyvale, Calif.

[21] Appl. No.: 09/205,978

[22] Filed: Dec. 4, 1998

[51] Int. Cl.[7] .................................................. G11C 7/00
[52] U.S. Cl. ............................................. 365/222; 365/236
[58] Field of Search .............................. 365/222, 189.01, 365/189.07, 189.12, 236; 711/106

[56] References Cited

U.S. PATENT DOCUMENTS 5,907,857  6/1999  Biswas ..................................... 365/222

OTHER PUBLICATIONS

Micron Technology, Inc., Synchronous DRAM Data Sheet, 16Mb: x16 SDRAM, 1998.
Micron Technology, Inc., Synchronous DRAM Data Sheet, 64Mb: x4, x8, x16 SDRAM, 1998.
Micron Technology, Inc., Synchronous DRAM Data Sheet, 64Mb: x32 SDRAM, 1998.
Micron Technology, Inc., Synchronous DRAM Data Sheet, 128 MEG: x4, x8, x16 SDRAM, 1998.
Micron Technology, Inc., Synchronous DRAM Data Sheet, 256Mb: x4, x8, x16 SDRAM, 1998.

*Primary Examiner*—David Nelms
*Assistant Examiner*—David Lam
*Attorney, Agent, or Firm*—Brinks Hofer Gilson & Lione

[57] ABSTRACT

A memory controller for a dynamic random access memory having counters for each chip select in the memory. The counters are incremented at a fixed interval. Programmable threshold values are provided which, when compared with the counters, indicate to the memory controller when a refresh should be opportunistically attempted and when a refresh is urgently required. The memory controller then either attempts to find an idle cycle to send the opportunistic refresh or blocks memory accesses to create a window for an urgently needed refresh. Once a refresh is sent to the memory, the appropriate counter is decremented accordingly.

35 Claims, 4 Drawing Sheets

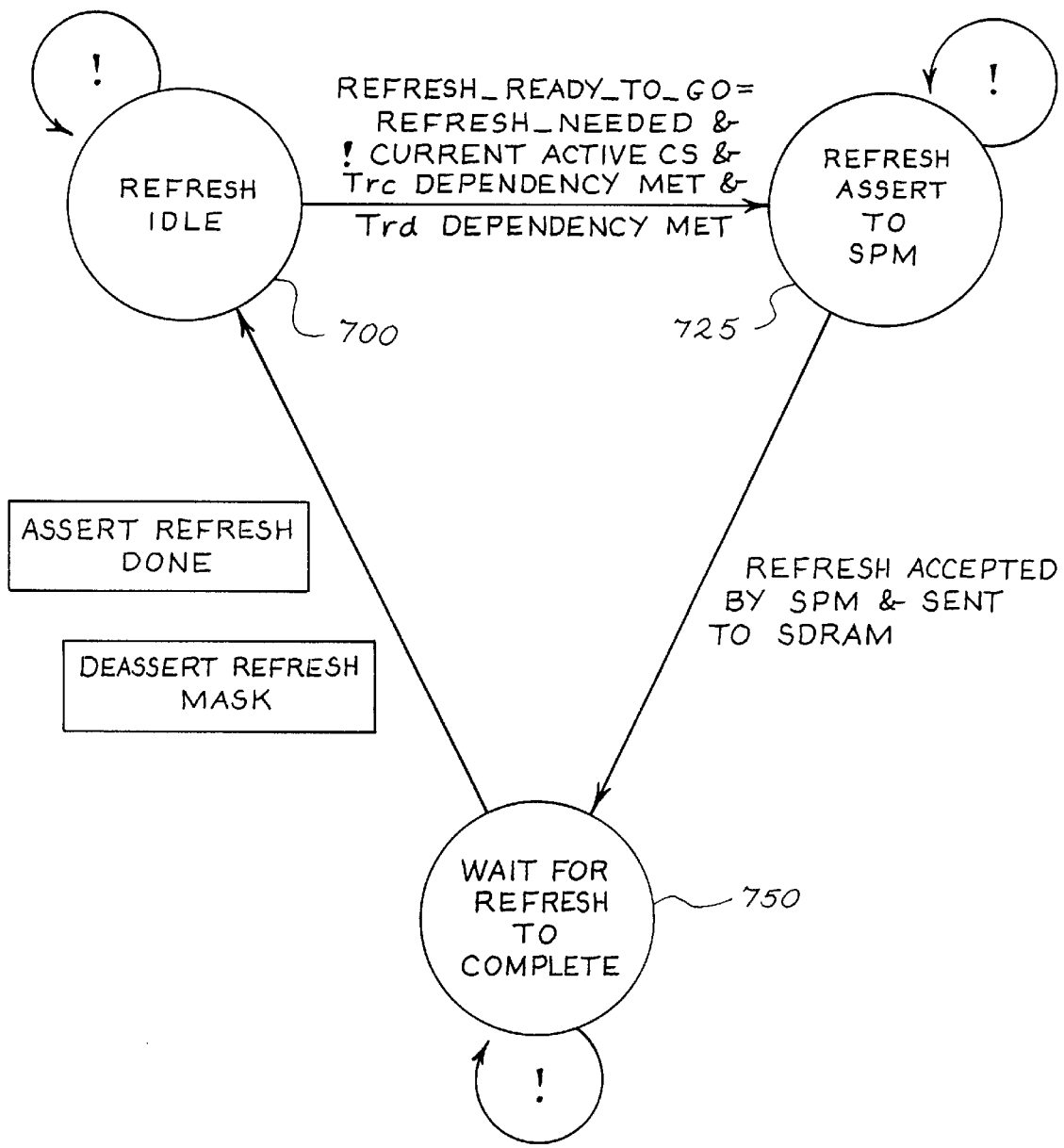

METHOD AND APPARATUS FOR OPTIMIZING MEMORY PERFORMANCE WITH OPPORTUNISTIC REFRESHING

FIELD OF THE INVENTION

This invention relates to computer systems and more particularly to memory control mechanisms and techniques employed within computer systems. This invention also relates to performance enhancement and optimization of memory control mechanisms for computer systems.

BACKGROUND OF THE INVENTION

A variety of techniques have been developed to increase the overall processing speed of computer systems. While improvements in integrated circuit processing technologies such as sub-micron processing capabilities have made it possible to dramatically increase the speed of the integrated circuitry itself, other developments in the architectures and bus transfer mechanisms of computer systems have also led to improvements in performance. Exemplary developments include the incorporation of cache memory subsystems as well as code pre-fetching mechanisms within computer systems.

One source of performance degradation is the refresh requirement of the memory. All dynamic random access memory (DRAM) chips, including synchronous DRAM (SDRAM or SynchDRAM) chips, store information in integrated circuits containing capacitors. Because capacitors lose their charge (or leak) over time, computer systems must include logic to refresh (or re-charge) these integrated circuits periodically. Without constant refreshing, DRAM loses any information stored in it—as it does when the computer is turned off or the power fails.

The frequency with which refresh must occur depends on the silicon technology used to manufacture the memory chip and the design of the memory cell itself. An exemplary SDRAM chip is Micron Technology's 64M SDRAM which requires refresh every 64 milliseconds (or every 64 million cycles at 100 MHz clock frequency). Refresh happens by row. The exemplary SDRAM has a counter for each bank which represents the current row in that bank that is next in line to be refreshed. On each refresh operation, the row indicated by the counter will be refreshed and the counter will increment to the next row. A refresh operation must be executed for every row in the SDRAM and at the appropriate frequency. Therefore, the exemplary SDRAM with 4,096 rows will require 4,096 refreshes with each row being refreshed every 64 milliseconds.

While a refresh operation is taking place, the portion of memory undergoing refresh cannot be accessed by the processor. Therefore, any memory requests for data stored in that memory must be stalled. Typically, each portion of memory is refreshed once or multiple times at pre-defined intervals, depending on the required refresh frequency and the number of rows per bank. However, a fixed refresh interval results in times where portions of the memory are not busy yet it is not time for a refresh and other times when portions of the memory are busy or in demand but requests to those portions must be stalled in order to refresh.

Accordingly, there is a need for an improved more efficient refresh mechanism which can opportunistically utilize idle memory cycles to perform a refresh and increase memory access performance by reducing the occurrences of the situation where requests to the memory must be stalled in order to refresh.

SUMMARY OF THE INVENTION

The problems outlined above are solved by a digital apparatus and method to refresh a dynamic ram computer memory according to the present invention. In one aspect of the invention, there is provided a memory control apparatus for controlling access to a main memory which is divided into multiple chip selects. The apparatus includes a programmable refresh interval counter with an increment output that is asserted each time the interval counter counts for a pre-defined interval and a chip select refresh counter for each chip select, with increment and decrement inputs and a counter output, which is operative to increment when the increment input is asserted and decrement when the decrement input is asserted The apparatus also includes first and second threshold registers holding first and second threshold values; a comparator coupled to the counter output of the chip select refresh counters and the first and second threshold registers. The comparator includes a chip select mask output, a refresh needed output and a refresh state machine input. The comparator is operative to compare the counter output of each chip select refresh counter with the first and second threshold values and assert the chip select mask output and the refresh needed output. The memory controller further includes a chip select request mask coupled to the chip select mask output which is operative to block requests to the corresponding chip select and a dependency calculator comprising a dependency-met output, operative to calculate when all refresh dependencies have been met and assert the dependency-met output. Further, the memory controller includes a refresh state machine coupled to the dynamic ram computer memory, the decrement input and the chip select request mask and responsive to the refresh needed output and the dependency met output. The refresh state machine is operative to assert a refresh to the chip select, to decrement the refresh counter and unblock the blocked corresponding chip select.

The present invention further contemplates a method for refreshing a dynamic random access memory using a memory controller wherein the memory is divided into at least one chip select and further wherein the memory controller comprises a memory request generator and a memory priority multiplexor coupled to the memory and the memory request generator. The memory controller further comprises a refresh generator coupled to the memory priority multiplexor, the refresh generator comprising a programmable refresh interval, at least one refresh counter for each chip select and first and second refresh thresholds. Each refresh counter comprises a counter output. The method comprises the steps of: incrementing the refresh counters each time the programmable refresh interval elapses; comparing the counter output of the refresh counters with the first and second refresh thresholds; transmitting a refresh request for the chip select to the memory priority multiplexor when the counter output of the corresponding refresh counter exceeds the first or second threshold; accepting the refresh request for transmission to the memory when the memory request generator has no other requests to that chip select; decrementing the refresh counter when the refresh request has been accepted by the memory priority multiplexor; and blocking the memory request generator from generating requests to that chip select when the counter output of the refresh counter exceeds the second threshold.

As a result of the present invention, there is an improved more efficient refresh mechanism which can opportunistically utilize idle SDRAM cycles to perform a refresh and can increase memory access performance by reducing the occurrences of the situation where requests to the SDRAM must be stalled in order to refresh.

BRIEF DESCRIPTION OF THE DRAWINGS

FIG. 4 is a state diagram depicting a state machine utilized by the memory controller of FIG. 2.

DETAILED DESCRIPTION OF THE PRESENTLY PREFERRED EMBODIMENTS

Figure 1:
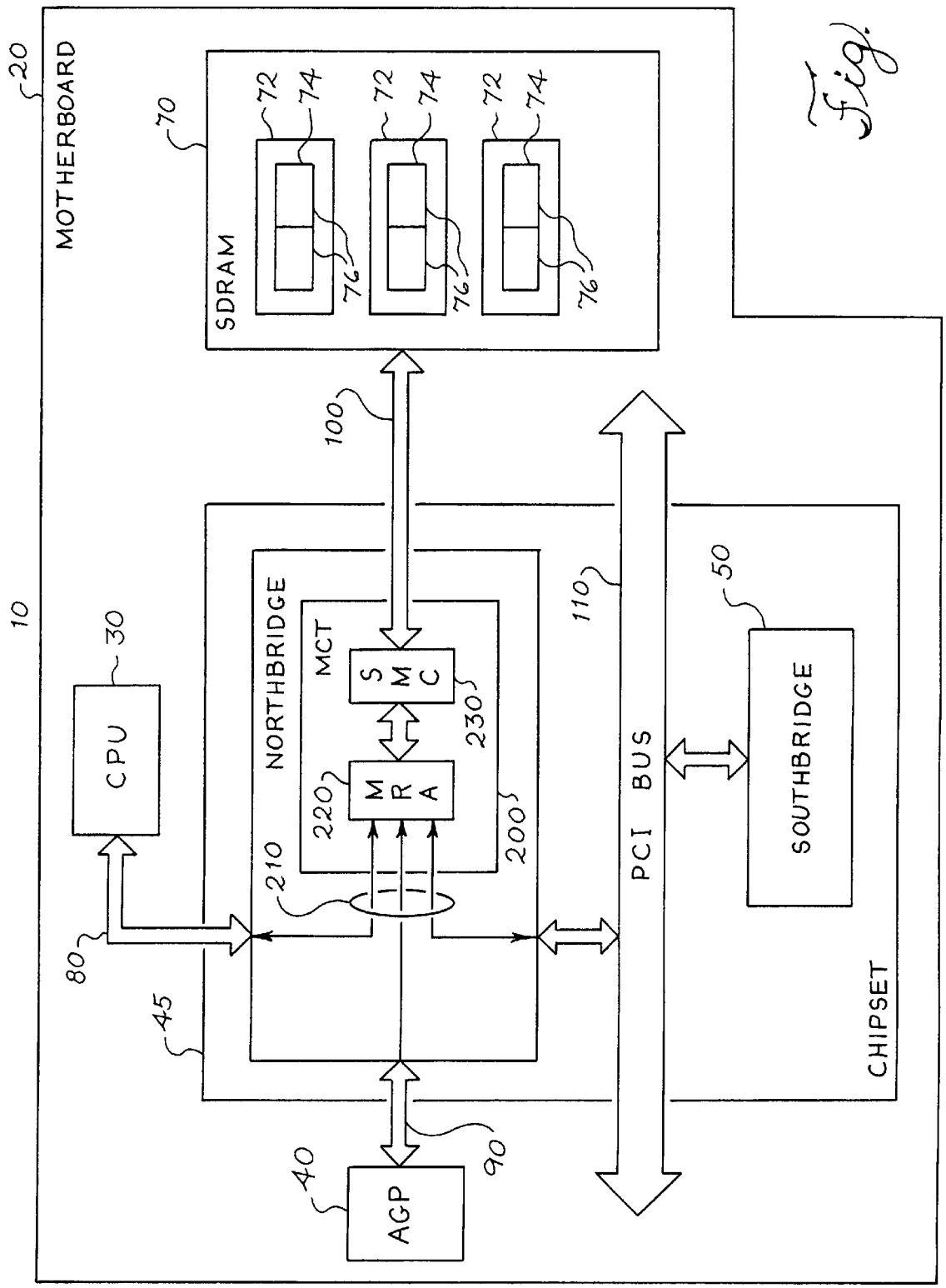
FIG. 1 is a block diagram of an exemplary computer system for use with the memory controller according to the preferred embodiment.

Turning now to the drawings, FIG. 1 shows selected components of an exemplary computer system 10 including a motherboard 20, a central processing unit (CPU) 30, an Advanced Graphics Port (AGP) 40, a chip set 45, a memory 70, a CPU bus 80, an AGP bus 90, a memory bus 100 and a PCI bus 110. It will be appreciated that CPU's 30, busses 90, 100, 110 and motherboards 20 are well known in the art. Further, it will be appreciated that the AGP 40 is but one example of a typical input/output (I/O) device included in the computer system 10, and that the computer system 10 can include a variety of I/O devices which are well known in the art.

The chip set 45 interconnects all of the components of the computer system 10 listed above to each other. In the preferred embodiment, the chip set 45 includes two chips known in the industry as the "Northbridge" 60 and "Southbridge" 50. Alternatively, the chip set 45 can include other chips and the Northbridge 60 and Southbridge 50 can, themselves, include more than one chip. An exemplary Northbridge 60 is the Irongate Northbridge chip manufactured by AMD, Inc. in Sunnyvale, Calif. The exemplary Northbridge 60 is designed to work with a motherboard 20 system bus clock speed of 100 MHZ, however higher clock rates can be used. The Northbridge 60 is designed to interconnect the memory 70 with the other devices in the computer system 10 that need to access the memory 70. Typically, these devices include the CPU 30 and newer technology I/O devices, such as the AGP 40 or I/O devices connected to the PCI bus 110, including the Southbridge 50. These devices are also known as memory requesters 210 and they make memory requests to the Northbridge 60 which then executes and completes these requests to the memory 70 (discussed in more detail below). The Southbridge 50 is usually designed to provide legacy compatibility with older technology I/O and interfaces these devices to the PCI bus 110. The exemplary Northbridge 60 is designed to connect to the CPU 30 using the CPU bus 80, to the AGP 40 using a dedicated AGP bus 90, to the memory 70 using a dedicated memory bus 100 and to all other devices using the PCI bus 110. It will be appreciated that the Northbridge can use other bus topologies to interconnect the various components on the motherboard 20.

The Northbridge chip includes a memory controller (MCT) 200 which controls and directs the flow of data between the memory requestors 210 and the memory 70 over the memory bus 100. The MCT 200 includes a memory request arbiter (MRA) 220 and an SDRAM memory controller (SMC) 230. The MCT 200 handles generation, prioritization and management of requests with the memory 70 (as explained below).

The memory 70 preferably includes several sockets 72 mounted on the motherboard 20 for receiving Dual Inline Memory Modules (DIMM's) 74. In the preferred embodiment, the motherboard 20 includes three sockets 72, each capable of holding one DIMM 74. Alternatively, single inline memory modules or other form of memory carrier can be used. The sockets 72 provide the connections between the DIMM's 74 and the memory bus 100. The memory bus 100 interconnects the memory 70 with the Northbridge 60. Each DIMM 74 includes a printed circuit board with one or more memory chips soldered to each side. In the preferred embodiment, these memory chips include synchronous dynamic random access memory (SDRAM) chips however, other types of DRAM memory chips can be used. Each side of the DIMM 74 is hereinafter referred to as a CS 76.

SDRAM chips are well known in the art as a derivative form of the DRAM type memory. SDRAM chips can run at higher clock speeds than conventional DRAM by synchronizing their operations to the rest of the computer system 10. Further, SDRAM chips also provide a burst access mode which gives the additional advantage of higher access times to the memory 70. In burst access mode, the Northbridge 60 is able to retrieve more data from the memory 70 with each access. This cuts down the number of requests that need to be sent to the memory 70 which saves bandwidth on the memory bus 100. SDRAM chips contain a mode register which can be initialized to the desired burst data size. Once the mode register is set, each access to the memory 70 will cause the SDRAM chips to dump the set amount of data. For example, in the preferred embodiment the memory bus 70 is 64 bits wide. If the burst data size is set to 8 quad words (QW) or 64 bytes, the Northbridge 60 can dispatch the address of the first QW and then over the period of the next 8 clock cycles, the memory 70 will send 1 QW per cycle over the memory bus 100 to fulfill the request without further requests from the Northbridge 60.

SDRAM chips come in different types based on the bit density of the chips. Examples are 64M×4b or 32M×8b manufactured by Micron Technology, Inc. The combination of the SDRAM density, the number of SDRAM chips soldered each DIMM 74 and the number of DIMM's 74 plugged into the available sockets 72 on the mother board 20 yields the total size of the main memory in the computer system.

Physically, the main memory of the computer system is typically divided by each CS. Each CS 76 is connected to a Chip Select (CS) signal on the memory bus 100 which is used by the Northbridge 60 to activate only those memory chips. There is a unique CS signal for each CS 76 allowing the Northbridge 60 to address each CS 76 independently. When a CS 76 is accessed, all memory chips that are a part of that CS are accessed simultaneously as though they were a single unit. This allows for interleaved accesses where if one CS 76 is busy servicing a request, the Northbridge 60 can send another request to another CS 76 without waiting for the first request to complete.

To further promote higher memory bandwidth, each CS 76 is typically divided into separate banks which can be independently accessed. This allows for interleaved memory accesses within a particular CS 76. The number of banks is dependent upon the manufacturer of the memory chips used in the DIMM 74. The physical layout of the memory storage circuits in each bank of each memory chip is usually in a grid arrangement (row/column) and the SDRAM provides inputs for a row address and a column address to access into this grid. Therefore, to access any location in the memory 70, the computer system 10 need only choose a particular CS 76, bank, row address and column address. In the preferred embodiment, each DIMM 74 has 2 CS 76 with each CS 76 having up to 4 banks, up to 8,192 (8 K) Rows and up to 2048 (2 K) Columns. The combination of specifying a particular CS 76, bank and row is also referred to herein as a page.

In addition, SDRAM memory chips provide buffer storage called an SDRAM row buffer (row buffer). There is usually one row buffer per bank. Once a page has been selected (also known as an Activate operation, discussed in more detail below), the SDRAM will move the selected row into the bank's row buffer. From the row buffer, the column address is used to select the desired data for read or write operations. Because moving a row into the row buffer destroys the contents of the row in the memory array, the memory control logic must be sure to cause the row buffer contents to be stored back in the memory array before moving a different row into the row buffer. Operation and use of the row buffers is described in more detail below.

A typical memory request takes places as follows. For example, the CPU 30 determines that it needs to read or write some data. The CPU 30 will dispatch a request along with an address to the Northbridge 60 to retrieve the desired data. The MCT 200 will convert the address into a physical memory location consisting of a CS 76, bank, row and column. The MCT 200 must then determine if the particular CS 76 is busy due to a timing dependency (discussed below). If the particular CS 76 is busy, the MCT 200 must wait for it to become available before sending an operation.

In order to access a particular row in the SDRAM, if this row is not already active (see below), the bank containing that row must be pre-charged. Effectively, pre-charging raises all of the bit lines (the wires that connect the rows in each bank to the SDRAM buffer) to a voltage that represents a logical 1. When the page is activated (or connected to the bit lines), any bits in the page containing logical zeroes cause the respective bit lines to drop to logical zero. This saves time versus initializing the bit lines to logical zero and waiting for the bits in the page representing a logical 1 to charge up the respective bit lines. A pre-charge operation also causes any currently active row, from a previous access to the bank, to be written back to the memory array from the row buffer so that the data is not lost (see below). An entire CS 76 or an individual bank can be pre-charged in several ways. Pre-charging occurs upon initialization of the memory, whenever there is a refresh to that CS 76 or whenever the MCT 200 dispatches a pre-charge operation to that CS 76 or bank. If the bank is not currently pre-charged, the MCT 200 will issue a pre-charge operation to the desired CS 76 in order to write any active rows back to the memory array and pre-charge the bit lines of the desired bank (or possibly all the banks) on that CS 76.

Next, an activate operation is sent to the desired CS 76 and bank along with the row address in order to activate the particular page onto the bit lines and transfer the page of data into the bank's row buffer. Note that, due to the nature of DRAM memory, an activate operation destroys the contents of that row in the memory array in the process of moving those contents to the row buffer. In order to replace the contents back in the memory array and ensure that they are not lost, a pre-charge operation (as discussed earlier) is necessary before activating another row into the row buffer. Once the page is in the row buffer, the appropriate read or write operation can be dispatched along with the column address identifying the bits to read or write. The data is then transferred to or from the Northbridge 60 and the memory 70 and ultimately passed back to the CPU 30. Note that once a row is activated and in the row buffer, the MCT 200 can perform many reads and writes to that row without performing an additional pre-charge or activate operation. Co-pending and commonly assigned applications entitled "QUEUE BASED MEMORY CONTROLLER", Ser. No. 09/205,665, filed on Dec. 4, 1998 and "METHOD AND APPARATUS FOR OPTIMIZING MEMORY PERFORMANCE WITH OPPORTUNISTIC PRE-CHARGING", Ser. No. 09/205,456, filed on Dec. 4, 1998, herein incorporated by reference, further describe operation of the MCT 200 for completing memory requests.

In typical computer systems 10, pre-charge, activate and read/write operations require a certain amount of time to complete. Another operation to a particular CS 76 may have to wait to be dispatched until the prior operation has completed. These delays are also referred to as timing dependencies. For example, utilizing the exemplary SDRAM from Micron Technology, Inc. a typical pre-charge operation to a CS 76 takes 30 nano seconds (or 3 cycles on a 100 MHz system bus). This delay is also referred to as Trp. This means that the MCT 200 must wait for Trp before sending the subsequent activate operation to the CS 76. Further, once the activate operation is sent, it takes 30 nano seconds (or 3 cycles on a 100 MHz system bus) for the row to be moved into the SDRAM row buffer. This delay is referred to as Trcd. This means that the MCT 200 must wait for Trcd to dispatch the read or write operation. Note that if the next operation following the activate is a pre-charge, the delay before sending the pre-charge is referred to as Tdpl and may be different than Trcd. Further, only one bank of one CS 76 can send or receive data over the memory bus 100 at any given time. Once a bank begins to send or receive data to or from the MCT 200, subsequent read and write operations to any CS 76 (but not activates or pre-charges to other banks) must wait for the data to finish transferring. These operational/timing dependencies only occur on any one CS 76 and/or bank. Requests to more than one CS 76 or to a different bank can be dispatched in a parallel or interleaved fashion.

Refresh operations to the memory must adhere to the above timing dependencies and further, they also create another timing dependency. While a refresh operation is taking place, the SDRAM cannot be accessed by the processor. Note that refresh operations are sent by CS 76 therefore the entire CS 76 will be unavailable during refresh. Typically, the time taken to perform a refresh operation is on the order of 90 nano-seconds for the exemplary 64 MB SDRAM or approximately 9 cycles for the exemplary computer system with a system bus running at 100 MHZ. This delay is referred to as Trc. The memory control logic must wait for Trc after sending a refresh before sending another command to that CS.

Figure 2:
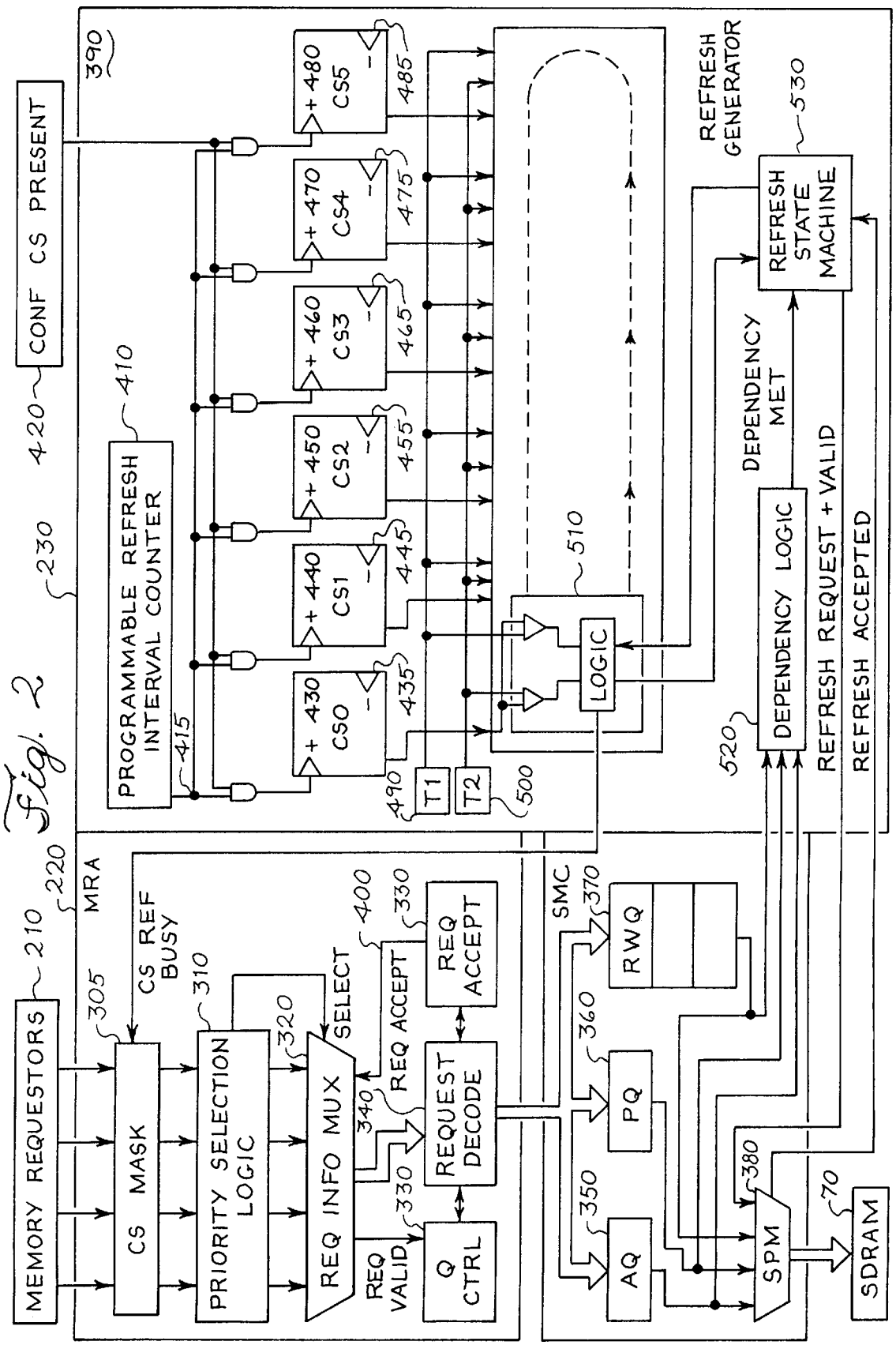
FIG. 2 is a block diagram depicting the memory controller of FIG. 1.

Referring now to FIG. 2, there is shown a more detailed view of the MRA 220 and the SMC 230. The MRA 220 includes inputs 300 for the memory requestors 210, CS mask logic 305, priority selection logic 310 and a request info. multiplexor (req. info. mux) 320. The SMC 230 includes a request acceptor 330, a request decoder 340, an activate operation queue (AQ) 350, a pre-charge operation queue (PQ) 360, a read/write operation queue (RWQ) 370, a SDRAM priority multiplexor (SPM) 380 and a refresh generator 390.

The memory requestors 210 make various requests on the inputs of the MRA 220 for access to the memory 70. The requests are first masked by the CS mask logic 305 which can block requests to particular CS's 76 which are in urgent need of refresh (described in more detail below). Unmasked requests are then passed to the priority selection logic 310 and the req. info. mux 320 which together decide which request will be sent to the memory 70 and then send that request to the SMC 230. If the SMC 230 sees a valid request from the MRA 220 and is able to handle the request, the request acceptor 330 will accept the request and assert the request accepted signal 400. The accepted request is then passed to the request decoder 340 which decodes the request into the required primitive memory operations, activate, pre-charge or read/write. In the preferred embodiment, the request acceptor 330 and request decoder 340 are implemented as a state machine. The decoded primitive operations are then enqueued in the appropriate operation queues, the AQ 350, the PQ 360 or the RWQ 370. These queues have logic to track timing and ordering dependencies among the various operations queued up in each queue and each further includes logic to pick a operation and present it to the SPM 380 for transmission to the memory 70. The SPM 380 is connected to the memory 70 by the memory bus 100 and includes inputs for the AQ 350, the PQ 360 and the RWQ 370. The SPM 380 also has an input for the refresh generator 390 (discussed below). The SPM 380 further includes logic which resolves the timing and ordering dependencies among the queues 350, 360, 370 and the refresh generator 390 and selects operations that can be sent to the memory 70.

The refresh generator 390 includes a programmable refresh interval counter 410, a configuration register 420, six refresh counters 430–480, one for each CS 76 that can be present in the system (two per DIMM socket 72) provided on the motherboard 20), an opportunisitc refresh threshold value 490, an urgent refresh threshold value 500, comparator logic 510, dependency logic 520 and a refresh state machine 530.

The programmable refresh interval counter 410 is a counter which increments on each clock cycle and counts for a pre-set refresh interval. When the interval of clock cycles has elapsed, the programmable refresh interval counter 410 asserts an increment signal 415 to the refresh counters 430–480 to increment their respective counts, it then resets and counts again. The programmable refresh interval is preferably set to a value that is below the required refresh frequency of the SDRAM chips installed in the memory 70 to allow for time to send the refresh operation (as discussed below). In the preferred embodiment, the interval can be programmed up to 16920 cycles/refresh with a minimum granularity of 64 cycles/refresh.

There is a refresh counter 430–480 for each CS 76 that can be installed on the motherboard 20. The configuration register 420 is programmed with the CS's 76 that are actually installed on the motherboard 20. The configuration register 420 is connected to each of the refresh counters 430–480 and prevents the counters corresponding to a non-existent CS 76 from incrementing when the programmable refresh interval counter 410 asserts the increment signal 415. This prevents unnecessary refreshes to CS's 76 that are not currently installed on the motherboard 20.

As was discussed earlier, each of the refresh counters 430–480 increments when the programmable refresh interval counter 410 asserts the increment signal 415 and the increment signal 415 is not blocked by the configuration register 420. Each of the counters 430–480 also includes a decrement input 435–485 which is connected to the comparator logic 510. When a refresh is sent to a particular CS 76, the comparator logic will decrement the refresh counter 430–480 corresponding to that CS 76. Preferably, each refresh counter 430–480 is three bits wide in order to register up to eight outstanding refreshes. These counters are initialized to zero upon power on of the computer system 10 and reset to zero anytime the computer system 10 is reset.

The opportunisitc refresh threshold value 490 is a hard wired digital value which represents the maximum number of outstanding refreshes (T1) that any one refresh counter 430–480 will be allowed to register before the comparator logic 510 and the refresh state machine 530 opportunistically attempt to send out refresh commands for that particular CS 76. The urgent refresh threshold value 500 is a hard wired digital value which represents the maximum number of outstanding refreshes (T2) that any one refresh counter 430–480 will be allowed to register before the comparator logic 510 and the refresh state machine 530 perform an urgent refresh for that particular CS 76. The opportunistic refresh threshold value 490 can have a value T1 between zero and eight, and it is preferable that T1 equal two. The urgent refresh threshold value 500 can have a value T2 between one and eight, and it preferable that T2 equal seven. Alternatively, the opportunistic refresh threshold value 490 and/or the urgent refresh threshold value 500 can be stored in a register or other programmable digital storage device.

The dependency logic 520 is connected to the operation queues 350, 360, 370 and tracks any timing or ordering dependencies which affect the ability to send a refresh to the memory 70. Such dependencies include that no refresh can be sent to the currently active CS 76, that from the time of the last non-pre-charge operation to the target CS 76, a refresh operation must wait for Trc before being sent, and that from the time of the last pre-charge operation to the target CS, a refresh operation must wait for Trp before being sent. When these dependencies are met, the dependency logic 520 asserts a signal to the refresh state machine 530 which allows a refresh to be asserted (discussed below).

Figure 3:
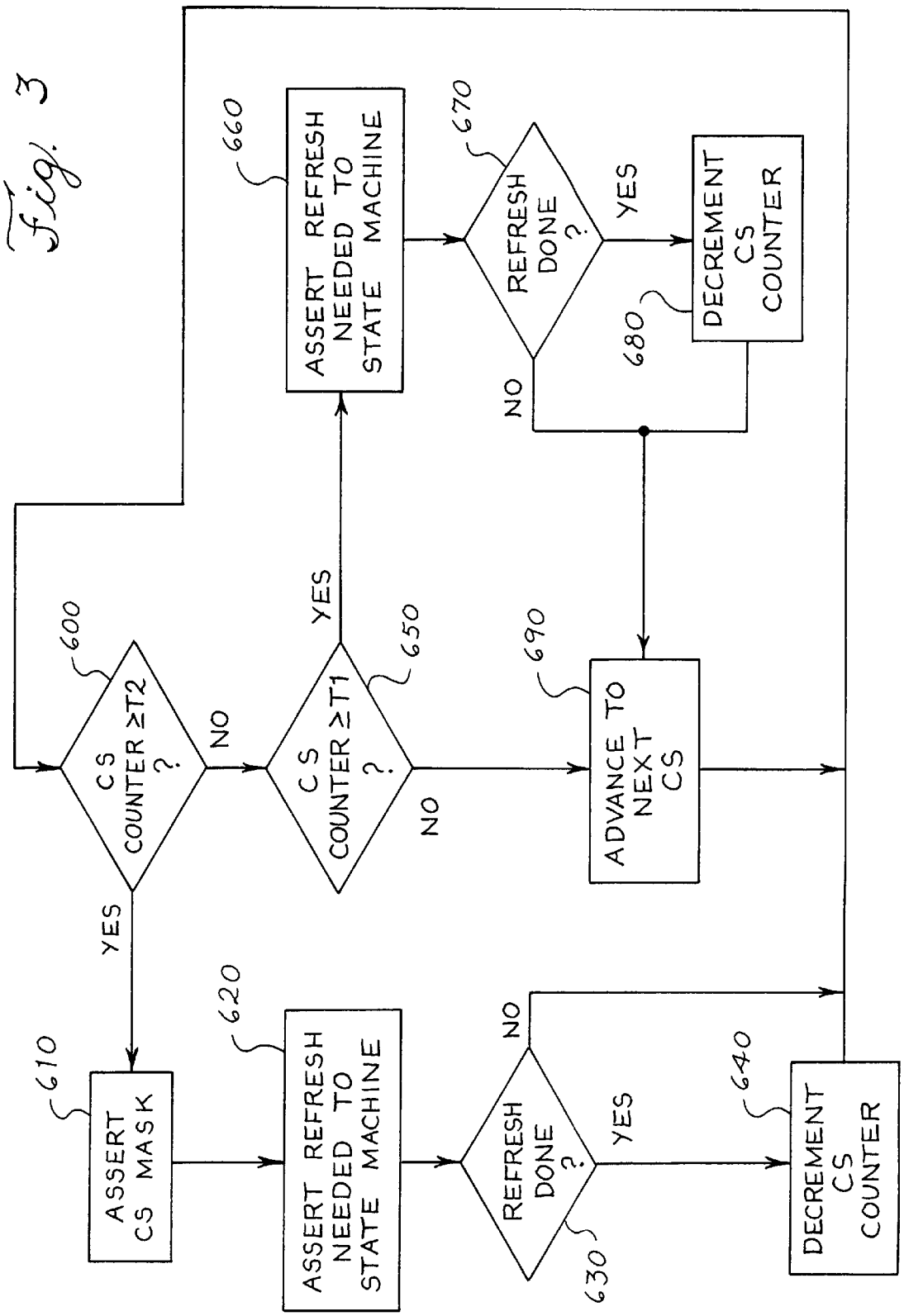
FIG. 3 is a flow chart depicting a method performed by the memory controller of FIG. 2.

For each refresh counter 430–480, the comparator logic 510 compares the counter value with the threshold values 490, 500. Starting with the refresh counter 430 for the first CS 76 (CS "0"), the comparator logic 510, on each clock cycle, moves to the next refresh counter 430–480 and performs its comparison. Referring to FIG. 3, there is shown a flow chart of the logic steps performed by the comparator logic 510 on each clock cycle. The comparator logic 510 first compares the counter output of the current refresh counter 430–480 to T2 (Step 600). If the counter output is greater than or equal to T2, the comparator logic 510 asserts a mask to the CS mask logic 305 in the MRA 220 to block requests from being sent to that CS 76 (Step 610). The comparator logic 510 then asserts a refresh_needed signal to the refresh state machine 530 (Step 620). If the refresh state machine asserts the refresh_done signal back to the comparator logic 510 (Step 630), the comparator logic 510 will decrement that particular CS's 76 refresh counter 430–480 (Step 640). Control is then returned to Step 600. If the refresh_done signal is not asserted (Step 630), the refresh counter 430–480 is not decremented and control is returned to Step 600. In this way, the comparator logic 510 will "stick" at a particular CS 76 in urgent need of refresh until enough refreshes have been sent to the memory 70 to reduce the refresh counter 430–480 below T2.

If the particular CS's 76 refresh counter's 430–480 counter output is less than T2 (Step 600), the comparator logic 510 compares the counter output to T1 (Step 650). If the counter output is greater than or equal to T1, the comparator logic 510 asserts a refresh_needed signal to the refresh state machine 530 (Step 660). If the refresh state machine 530 asserts the refresh_done signal back to the comparator logic 510 (Step 670), the comparator logic 510 will decrement that particular CS's 76 refresh counter 430–480 (Step 680). If the refresh state machine 530 does not assert the refresh_done signal (Step 670), the refresh counter 430–480 is not decremented. The comparator logic 510 then moves on to check the next refresh counter 430–480 for the next CS 76 (Step 690) and control is returned to Step 600. If the particular CS's 76 refresh counter's 430–480 counter output is less than T1 (Step 650), the comparator logic 510 moves on to check the next refresh counter 430–480 for the next CS 76 (Step 690) and control is returned to Step 600. It is preferable that the comparator logic 510 check each CS's 76 refresh counter 430–480 in numeric order. Alternately, a priority based ordering can be used.

The refresh state machine 530 is shown in FIG. 4. The refresh state machine 530 is initially in an idle state 700. The refresh state machine 530 will transition to the refresh assert state 725 when it receives the refresh_needed signal from the comparator logic 510 and the dependency logic 520 indicates that all refresh dependencies have been met. In the refresh assert state 725, the refresh state machine 530 will attempt to send a refresh to the SPM 380 for transmission to the memory 70. When an idle cycle to the CS 76 in need of refresh becomes available, the SPM 380 will accept the refresh operation and indicate that the refresh operation has been accepted back to the refresh state machine 530. The refresh state machine 530 will then transition from the refresh assert state 725 to the wait for refresh state 750. In wait for refresh state 750, the refresh state machine 530 will wait for a pre-defined period of time for the refresh operation to be completed in the memory 70. This time is preferably Trc, however longer or shorter time periods can be used. Once this time has elapsed, the refresh state machine 530 will transition from the wait for refresh state 750 back to the refresh idle state 700. The refresh state machine 530 will also concurrently assert the refresh_done signal back to the comparator logic 510 and de-assert the CS mask logic 305 from blocking requests to the particular CS 76.

The SPM 380 is designed to select requests to transmit to the memory 70 on a priority basis. Refreshes from the refresh generator 390 are the lowest priority. In this way, refresh operations can be opportunistically transmitted when a CS 76 is idle. If a CS 76 is in urgent need of a refresh, the refresh generator 390 can block requests from being sent to that CS 76 and thereby create an idle window for the SPM 380 to send the refresh. This system then allows for refreshes to be sent to the memory 70 at the appropriate frequency while maximizing efficiency and optimal memory bus utilization by utilizing idle cycles to satisfy the refresh requirement whenever possible.

It is intended that the foregoing detailed description be regarded as illustrative rather than limiting and that it is understood that the following claims including all equivalents are intended to define the scope of the invention.

We claim:

1. A digital apparatus to refresh a dynamic ram computer memory, said dynamic ram computer memory comprising at least one chip select, said apparatus comprising:
    a programmable refresh interval counter comprising an increment output;
    at least one chip select refresh counter for each of said at least one chip select comprising an increment input, a decrement input and a counter output, said increment input coupled to said increment output;
    first and second threshold values;
    a comparator coupled to said counter output and said first and second threshold values, said comparator comprising a chip select mask output, a refresh needed output and a refresh state machine input;
    a chip select request mask coupled to said chip select mask output;
    a dependency calculator comprising a dependency-met output; and
    a refresh state machine coupled to said dynamic ram computer memory, said decrement input and said chip select request mask and responsive to said refresh needed output and said dependency met output.

2. The digital apparatus of claim 1 wherein said interval counter is operative to assert said increment output each time said interval counter counts for a pre-defined interval.

3. The digital apparatus of claim 1 wherein said at least one refresh counter is operative to increment when said increment input is asserted and decrement when a decrement input is asserted.

4. The digital apparatus of claim 1 wherein said comparator is operative to compare said counter output of said at least one chip select refresh counter with said first and second threshold values and assert said chip select mask output and said refresh needed output.

5. The digital apparatus of claim 1 wherein said chip select request mask is operative to block requests to the corresponding chip select of said at least one chip select.

6. The digital apparatus of claim 1 wherein said dependency calculator is operative to calculate when all refresh dependencies have been met and assert said dependency-met output.

7. The digital apparatus of claim 1 wherein said refresh state machine is operative to assert a refresh to said at least one chip select, to decrement said refresh counter and unblock said blocked corresponding chip select.

8. The digital apparatus of claim 1 wherein said refresh state machine comprises the following states:
    a refresh_idle state;
    a refresh_assert state; and
    a wait_for_refresh state.

9. The digital apparatus of claim 8 wherein:
    said refresh_idle state is coupled to said dependency-met output and said refresh needed output and operative to transition to said refresh_assert state when said dependency calculator asserts said dependency met output and said comparator asserts said refresh needed output;
    said refresh_assert state is coupled to said dynamic ram computer memory and operative to assert a refresh to said at least one chip select and further operative to transition to said wait_for_refresh state when said refresh is accepted by said computer memory; and
    said wait_for_refresh state is coupled to said decrement input and said chip select request mask and operative to wait for a fixed period of time and then decrement said refresh counter, unblock said blocked corresponding chip select and transition to said refresh_idle state.

10. The digital apparatus of claim 9 wherein said wait_for_refresh state waits for said fixed period of time equal to Trc.

11. The digital apparatus of claim 1 wherein said refresh state machine comprises a first register coupled to a first set of logic, a second register coupled to a second set of logic and a third register coupled to a third set of logic, each of which represents a state, wherein:
    said first register represents a refresh_idle state and further wherein said first set of logic is coupled to said second register, said dependency-met output and said refresh needed output, wherein said first set of logic is operative to clear said first register and set said second register when said first register is set, said dependency calculator asserts said dependency met output and said comparator asserts said refresh needed output;
    said second register represents a refresh_assert state, and further wherein said second set of logic is coupled to said third register and to said computer memory and operative to assert a refresh to said at least one chip select and further operative to clear said second register and set said third register when said second register is set and said refresh is accepted by said computer memory; and said third register represents a wait_for_refresh state and further wherein said third set of logic is coupled to said first register, said decrement input and said chip select request mask and operative to wait for a fixed period of time and then decrement said refresh counter and unblock said blocked corresponding chip select and further operative to clear said third register and set said first register when said third register is set and said fixed period of time has elapsed.

12. The digital apparatus of claim 1 further comprising a chip select present configuration register operative to prevent incrementing of said at least one chip select refresh counter when the corresponding chip select of said at least one chip select is not populated.

13. The digital apparatus of claim 1 wherein said dynamic ram integrated circuits are synchronous dynamic ram integrated circuits.

14. The digital apparatus of claim 1 wherein said refresh dependencies comprise:
that said at least one chip select is currently inactive;
that any prior activate operation to said at least one chip select has completed; and
that any prior pre-charge operation to said at least one chip select has completed.

15. The digital apparatus of claim 1 wherein said first threshold value is set to 1 and said second threshold value is set to 7.

16. The digital apparatus of claim 1 wherein said first and second threshold values are hard wired digital values.

17. The digital apparatus of claim 1 wherein said first threshold value is stored in a first programmable register and said second threshold value is stored in a second programmable register.

18. A method for refreshing a dynamic random access memory using a memory controller wherein said memory is divided into at least one chip select and further wherein said memory controller comprises a memory request generator and a memory priority multiplexor coupled to said memory and said memory request generator, said memory controller further comprising a refresh generator coupled to said memory priority multiplexor, said refresh generator comprising a programmable refresh interval, at least one refresh counter for each of said at least one chip select and first and second refresh thresholds, said at least one refresh counter comprising a counter output, said method comprising the steps of:

incrementing said at least one refresh counter each time said programmable refresh interval elapses;
comparing said counter output of said at least one refresh counter of said at least one chip select with said first refresh threshold;
comparing said counter output of said at least one refresh counter of said at least one chip select with said second refresh threshold;
transmitting a refresh request for said at least one chip select to said memory priority multiplexor when said counter output of said at least one refresh counter exceeds said first threshold;
transmitting a refresh request for said at least one chip select to said memory priority multiplexor when said counter output of said at least one refresh counter exceeds said second threshold;

accepting said refresh request for transmission to said memory when said memory request generator has no requests to said at least one chip select;
decrementing said at least one refresh counter when said refresh request has been accepted by said memory priority multiplexor; and
blocking said memory request generator from generating requests to said at least one chip select when said counter output of said at least one refresh counter exceeds said second threshold.

19. The methods of claim 18 wherein said second threshold is greater than said first threshold.

20. The method of claim 18 wherein said first threshold value is set to 1 and said second threshold value is set to 7.

21. The method of claim 18 wherein said programmable refresh interval equals the necessary refresh frequency of said dynamic random access memory.

22. The method of claim 18 wherein said memory controller comprises more than one refresh counter and further wherein said steps of comparing compare each of said more than one refresh counters in sequential order by respective chip select to said first and second thresholds.

23. The method of claim 18 further comprising the step:
repeating said steps of transmitting, accepting, and decrementing until said at least one refresh counter is less than said second threshold.

24. The method of claim 18 further comprising the step of:
verifying that all refresh dependencies have been met before transmitting said refresh request to said memory priority multiplexor.

25. The method of claim 18 wherein said step of decrementing further comprises the step of waiting for a fixed period of time before decrementing said refresh counters.

26. The method of claim 25 wherein said fixed period of time is equal to Trc.

27. The method of claim 18 further comprising the step of:
unblocking said memory request generator from generating requests to said at least one chip select when said counter output of said at least one refresh counter is less than said second threshold.

28. An opportunistic refresh generator for a dynamic random access memory, wherein said memory comprises at least one chip select, said refresh generator comprising:

a programmable refresh interval counter operative to count for a preset interval and assert an increment signal when said interval has elapsed;
at least one refresh counter comprising a counter output wherein said at least one refresh counter is responsive to said increment signal and operative to increment said counter output when said increment signal is asserted, and further responsive to a decrement signal and operative to decrement said counter output when said decrement signal is asserted;
first and second threshold values;
a comparator responsive to said counter output and said first and second threshold values and operative to assert a refresh needed signal when said counter output exceeds said first threshold value and to assert a block signal and a refresh needed signal when said counter output exceeds said second threshold, said comparator further operative to assert said decrement signal to said at least one refresh counter when a refresh done signal is asserted;
a dependency calculator operative to assert a dependency met signal when all refresh dependencies have been met; and a state machine responsive to said dependency met signal and said refresh needed signal and operative to transmit a refresh request to said memory when said dependency met signal is asserted and said refresh needed signal is asserted, said state machine further operative to assert said refresh done signal and de-assert said block signal when said refresh request has been transmitted.

29. The opportunistic refresh generator of claim 28 wherein said state machine comprises the following states:

a refresh_idle state;

a refresh_assert state; and a wait_for_refresh state.

30. The opportunistic refresh generator of claim 29 wherein:

said refresh_idle state is coupled to said dependency-met signal and said refresh needed signal and operative to transition to said refresh_assert state when said dependency calculator asserts said dependency met signal and said comparator asserts said refresh needed signal;

said refresh_assert state is coupled to said memory and operative to assert a refresh to said at least one chip select and further operative to transition to said wait_for_refresh state when said refresh is accepted by said computer memory; and said wait_for_refresh state is coupled to said comparator and operative to wait for a fixed period of time and then assert said refresh done signal, de-assert said block signal and transition to said refresh_idle state.

31. The method of claim 30 wherein said fixed period of time is equal to Trc.

32. The opportunistic refresh generator of claim 28 wherein said refresh state machine comprises a first register coupled to a first set of logic, a second register coupled to a second set of logic and a third register coupled to a third set of logic, each of which represents a state, wherein:

said first register represents a refresh_idle state and further wherein said first set of logic is coupled to said second register, said dependency-met signal and said refresh needed signal, wherein said first set of logic is operative to clear said first register and set said second register when said first register is set, said dependency calculator asserts said dependency met signal and said comparator asserts said refresh needed signal;

said second register represents a refresh_assert state, and further wherein said second set of logic is coupled to said third register and to said memory and operative to assert a refresh to said at least one chip select and further operative to clear said second register and set said third register when said second register is set and said refresh is accepted by said memory; and said third register represents a wait_for_refresh state and further wherein said third set of logic is coupled to said first register and said comparator and operative to wait for a fixed period of time and then assert said refresh done signal and de-assert said block signal and further operative to clear said third register and set said first register when said third register is set and said fixed period of time has elapsed.

33. The method of claim 31 wherein said fixed period of time is equal to Trc.

34. The opportunistic refresh generator of claim 28 further comprising a configuration register operative to disable said at least one refresh counter from incrementing.

35. The opportunistic refresh generator of claim 28 wherein said first threshold value is set to 1 and said second threshold value is set to 7.

* * * * *

UNITED STATES PATENT AND TRADEMARK OFFICE
CERTIFICATE OF CORRECTION

PATENT NO. : 6,046,952
DATED : April 4, 2000
INVENTOR(S) : Stephen T. Novak et al.

It is certified that error appears in the above-identified patent and that said Letters Patent is hereby corrected as shown below:

Claim 9,
Line 5, change "dependency met" to -- dependency-met --.

Claim 11,
Line 12, change "dependency met" to -- dependency-met --.

Claim 30,
Line 6, change "dependency met" to -- dependency-met --.

Claim 31,
Line 1, change "method" to -- opportunistic refresh generator --.

Claim 32,
Line 12; change "dependency met" to -- dependency-met --.

Claim 33,
Line 1, change "method" to -- opportunistic refresh generator --.

Signed and Sealed this

Second Day of October, 2001

Attest:

*Nicholas P. Godici*

NICHOLAS P. GODICI
*Attesting Officer*    *Acting Director of the United States Patent and Trademark Office*